(12) United States Patent
Baba et al.

(10) Patent No.: US 7,758,973 B2
(45) Date of Patent: Jul. 20, 2010

(54) OPTICAL FILTER AND ORGANIC EL DISPLAY USING THE SAME

(75) Inventors: Yasuko Baba, Tokyo-to (JP); Masaaki Asano, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 12/057,583

(22) Filed: Mar. 28, 2008

(65) Prior Publication Data

US 2008/0180025 A1    Jul. 31, 2008

Related U.S. Application Data

(62) Division of application No. 10/785,489, filed on Feb. 24, 2004, now Pat. No. 7,368,863.

(30) Foreign Application Priority Data

Feb. 28, 2003    (JP) .............................. 2003-052204

(51) Int. Cl.
*H01J 5/16*    (2006.01)
*D06N 7/04*    (2006.01)
*G02B 5/30*    (2006.01)
*G02B 17/00*    (2006.01)

(52) U.S. Cl. ...................... 428/690; 428/917; 428/163; 428/167; 428/323; 313/504; 313/506; 313/112; 359/491; 359/599

(58) Field of Classification Search ................ None
See application file for complete search history.

(56) References Cited

U.S. PATENT DOCUMENTS

2006/0050387 A1* 3/2006 Arakawa et al. ............ 359/491
2007/0181246 A1* 8/2007 Yamashita et al. .......... 156/235

* cited by examiner

*Primary Examiner*—D. Lawrence Tarazano
*Assistant Examiner*—Camie S Thompson
(74) *Attorney, Agent, or Firm*—Ladas & Parry LLP

(57) ABSTRACT

An object of the present invention is to solve the problem of losing a part of the incident light due to the irregular reflection of the incident light if a layer containing fine particles is formed by coating for the purpose of roughing when providing measures to prevent the reflection of the light at the surface of the color filter layer or at the surface of the color conversion layer inside a display, or a problem of difficulty in management of the paint for obtaining a certain roughened surface or a problem of increase of the number of processes to prevent the reflection when preventing the reflection by laminating plural layers of different refractive indices. By for example, laminating a black matrix 12, a color filter layer 13, a color conversion layer 15 or the like on a transparent substrate 11, and above thereof, combining an optical filter 10 having a minute concave-convex surface 14, with an endless number of minute concave-convex by a pitch of the wavelength of the light or less formed, with an organic EL element 20, the object can be achieved.

15 Claims, 4 Drawing Sheets

OPTICAL FILTER AND ORGANIC EL DISPLAY USING THE SAME

BACKGROUND OF THE INVENTION

1. Field of the Invention

The present invention relates to an improved optical filter capable of efficiently preventing reflection of the light between an optical filter such as a color filter substrate and a color converting substrate, and a light emitting part in various kinds of displays such as an organic electroluminescent (EL) display, in particular, capable of improving the light incident efficiency to the optical filter, and a display comprising the same, in particular, an organic EL display.

2. Description of the Related Art

The organic EL element, in principle, has a structure with an organic EL light emitting layer interposed in between an anode and a cathode. For providing an organic EL display capable of providing the color display using an organic EL element practically, there are (1) a method of arranging organic EL elements each emitting the three primary colors, (2) a method of combining an organic EL element for emitting a white light and a color filter layers of the three primary colors, and (3) a CCM method of combining an organic EL element for emitting a blue light and a color converting layer (CCM layer) for the color conversion from blue to green, and from blue to red, or the like.

In particular, in the (3) CCM method, since only one kind of the organic EL element to emit the same color is needed, there is no need of providing the organic EL elements of each color in an uniform property, as in the organic EL display of the method (1). Moreover, the disadvantage of the low white light utilization ratio when decomposing the color with color filters of the three primary colors, as in the organic EL display of the method (2), is solved so that the luminance of the display can be improved by heightening the conversion efficiency of the CCM layer, and thus it attracts the attention.

In the case of the method (2), a part of the output light form the organic EL element is reflected when being incident into the color filter layer in the display. And in the case of the method (3), in the display, a part of the output light from the organic EL element is reflected when being incident into the color conversion layer. Moreover, also in the case of the method (1), since a color filter layer is generally accompanied, a part of the output light from the organic EL element is reflected when being incident into the color filter layer in the display. These reflection slower the incident efficiency of the light into the color filter layer, or the incident efficiency of the light into the cover conversion layer.

For eliminating the reflection on the surface of the color filter layer or on the surface of the color conversion layer in the display, (a) roughing of the surface, (b) providing a reflection preventing layer comprising plural layers of different refractive indices, or the like can be considered. However, if a layer containing fine particles is laminated by coating or the like, for the purpose of (a) roughing, since a part of the light is lost due to the irregular reflection of the incident light, the incident efficiency from the display into the color filter layer or the color conversion layer is lowered. Moreover, management of the paint for obtaining a certain roughened surface is difficult. In the case of (b), plural layers should be laminated so that the number of processes for preventing the reflection is increased.

The applicant has proposed a reflection preventing film comprising a transparent layer made of a cured product of an ionizing radiation curing type resin composition, having a concave-convex part with an endless number of minute concave-convex formed on a transparent base material film by a pitch of the wavelength of the light or less. And furthermore, the applicant has proposed the prevention of the reflection of the external light by laminating or disposing a reflection preventing film on the surface of various kinds of displays (for example, Japanese Patent Application Laid-Open (JP-A) No. 2001-264520 (see page 3, FIG. 1)).

However, according to the above JP-A No. 2001-264520 (page 3, FIG. 1), the reflection preventing film is intended to apply on the surface of the display, that is, the part where image light from the display is finally output. The prevention of the reflection of the light deriving from the external light, that is, the interior illumination, or the like is intended in the reference, but not the reflection of the image light, and thus the incident efficiency of the light from the display into the surface of the color filter layer or into the color conversion layer is not intended.

SUMMARY OF THE INVENTION

An object of the present invention is to solve the problem of deterioration of the incident efficiency due to the irregular reflection of the incident light if a layer containing fine particles is formed by coating for the purpose of roughing when providing measures to prevent the reflection of the light at the surface of the color filter layer or at the surface of the color conversion layer inside a display, or a problem of difficulty in management of the paint for obtaining a certain roughened surface or a problem of increase of the number of processes to prevent the reflection when preventing the reflection by laminating plural layers of different refractive indices.

As a result of investigation of the present inventor, the above-mentioned problems can be solved by improving the incident efficiency by adopting the minute concave-convex surface with an endless number of concave-convex formed by a pitch of the wavelength of the light or less on the surface of the color filter layer or on the surface of the color conversion layer inside a display as follows.

The present invention provides an optical filter comprising a laminated body with at least a color filter layer, for color correction of an incident light per each pixel, laminated on a transparent substrate; having a minute concave-convex surface with an endless number of minute concave-convex formed, by a pitch of the wavelength of the light or less, on a surface of the laminated body which is a surface opposite to the transparent substrate.

The present invention provides an optical filter comprising a laminated body with at least a color conversion layer, for color conversion of an incident light per each pixel, laminated on a transparent substrate; having a minute concave-convex surface with an endless number of minute concave-convex formed, by a pitch of the wavelength of the light or less, on a surface of the laminated body which is a surface opposite to the transparent substrate.

The present invention provides an optical filter comprising a laminated body with at least two layers of a color filter layer for color correction of an incident light per each pixel and a color conversion layer for color conversion of the incident light per each pixel are laminated in this order on a transparent substrate; having a minute concave-convex surface with an endless number of minute concave-convex formed, by a pitch of the wavelength of the light or less, on a surface of the laminated body which is a surface opposite to the transparent substrate.

In the above mentioned inventions, it is preferable that a hard coating layer is further laminated on a surface of the laminated body which is a surface opposite to the transparent substrate; and a surface of the hard coating layer, which is a surface opposite to the transparent substrate, is the minute concave-convex surface.

In the above mentioned inventions, it is preferable that a hard coating layer and a barrier layer are further laminated in this order on a surface of the laminated body which is opposite to the transparent substrate, and a surface of the barrier layer, which is a surface opposite to the transparent substrate, is the minute concave-convex surface.

In the above mentioned inventions, it is preferable that a hard coating layer, a barrier layer, and a transparent layer are further laminated in this order on a surface of the laminated body which is a surface opposite to the transparent substrate; and a surface opposite to the transparent substrate is the minute concave-convex surface.

The present invention provides an organic EL display, wherein an organic EL element comprising a light emitting layer for emitting a light per each pixel is disposed on the minute concave-convex surface side of the optical filter according to claim 1.

In the above mentioned inventions, it is preferable that the optical filter and the organic EL element are disposed with a gap in between.

In the above mentioned inventions, it is preferable that the space in between the optical filter and the organic EL element is filled with a transparent resin.

In the above mentioned inventions, it is preferable that a minute concave-convex surface with an endless number of minute concave-convex formed, by a pitch of the wavelength of the light or less, is provided on the optical filter side of the EL element.

In the above mentioned inventions, it is preferable that the organic EL element is of an active matrix driving type.

According to the present inventions, since a color filter layer for the color correction of the incident light per each pixel is laminated on a transparent substrate, and a minute concave-convex surface, with an endless number of minute concave-convex formed by a pitch of the wavelength of the light or less, is formed on the color filter layer side, an optical filter having a high incident efficiency of the incident light from the minute concave-convex surface side can be provided.

According to the present inventions, since a color conversion layer for the color conversion of the incident light per each pixel is laminated on a transparent substrate, and a minute concave-convex surface, with an endless number of minute concave-convex formed by a pitch of the wavelength of the light or less, is formed on the color conversion layer side, an optical filter having a high incident efficiency of the incident light from the minute concave-convex surface side can be provided.

According to the present inventions, since a color filter layer for the color correction of the incident light per each pixel and a color conversion layer for the color conversion of the incident light per each pixel are laminated successively on a transparent substrate, and a minute concave-convex surface, with an endless number of minute concave-convex formed by a pitch of the wavelength of the light or less, is formed on the color conversion layer side, an optical filter having a high incident efficiency of the incident light from the minute concave-convex surface side can be provided.

According to the present inventions, in addition to the effect of the above mentioned inventions, since a hard coating layer is further laminated, an optical filter, with a flattened lower layer surface which capable of protecting the lower layer and also capable of separating the lower layer and an organic EL element to be disposed thereon, can be provided.

According to the present inventions, in addition to the effect of the above mentioned inventions, since a hard coating layer and a barrier layer are laminated successively, in addition to the effect of laminating the hard coating layer, by laminating the barrier layer, an optical filter capable of blocking permeation of the air and the water vapor more effectively from below to the lower layer and the organic EL element disposed thereon, can be provided.

According to the present inventions, in addition to the effect of the above mentioned inventions, since a hard coating layer, a barrier layer and a transparent layer are laminated successively, in addition to the effect of laminating the hard coating layer and the barrier layer, by laminating the transparent layer, since the function of preventing the reflection is performed mainly by the transparent layer, an optical filter can be provided in which, when laminating the lower layer, there is no need to consider deterioration of the function thereof, and the transparent layer can be formed with a material capable of easily forming the minute concave-convex surface.

According to the present inventions, since an organic EL element is disposed on the minute concave-convex surface side of the optical filter of the above mentioned inventions, an organic EL display capable of providing the effect of the any of the optical filters can be provided.

According to the present inventions, in addition to the effect of the above mentioned inventions, since the incident efficiency of the light from the minute concave-convex surface of the optical filter is high, even if there is a gap in between the optical filter and the organic EL element, there is no trouble inputting the light and the organic EL display without a risk of damaging the both by rubbing in handling can be provided.

According to the present inventions, in addition to the effect of the above mentioned inventions, an organic EL display capable of preventing the entrance of the air and the water from the gap in between the optical filter and the organic EL element can be provided.

According to the present inventions, in addition to the effect of the above mentioned inventions, since a minute concave-convex surface is provided also on the organic EL element side, an organic EL display capable of further preventing the reflection in the inside can be provided.

According to the present inventions, in addition to the effect of the above mentioned inventions, an organic EL display capable of enlarging the screen size can be provided.

DESCRIPTION OF THE PREFERRED EMBODIMENT

Figure 1A:
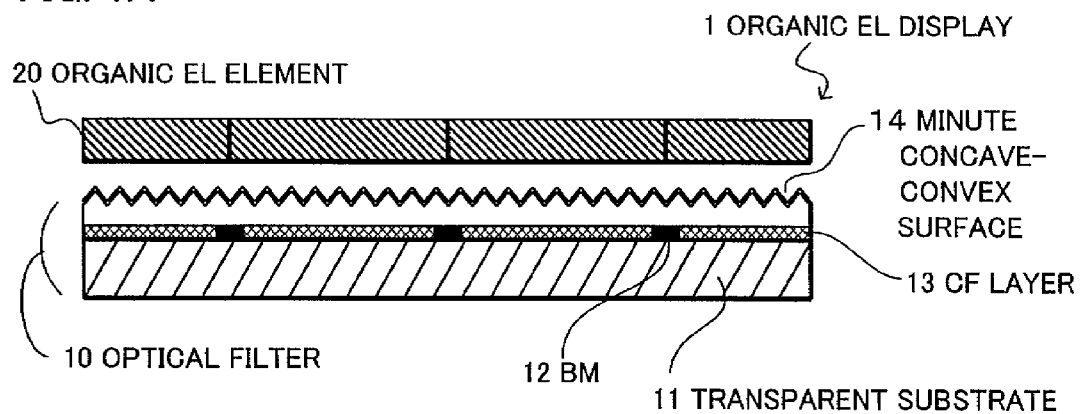
FIGS. 1A to 1C are diagrams showing an organic EL display and an optical filter of the present invention.
Figure 1B:
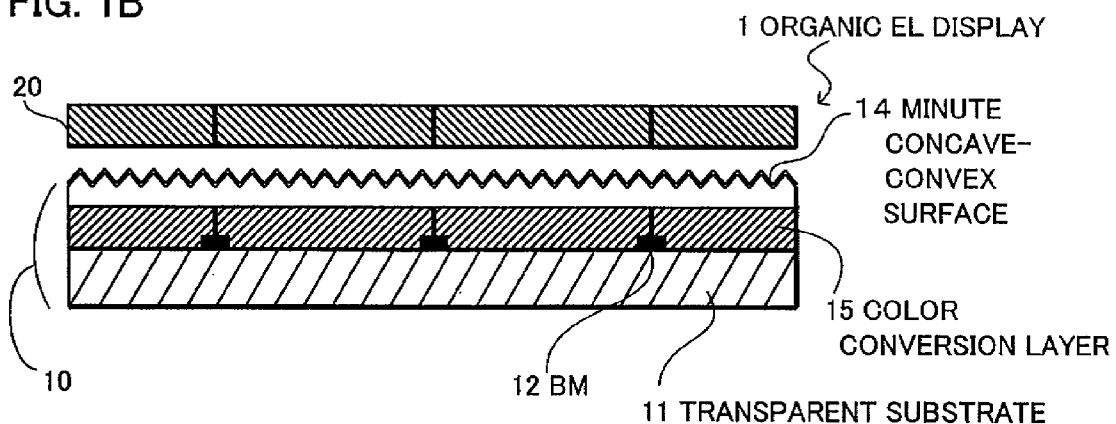
Figure 1C:
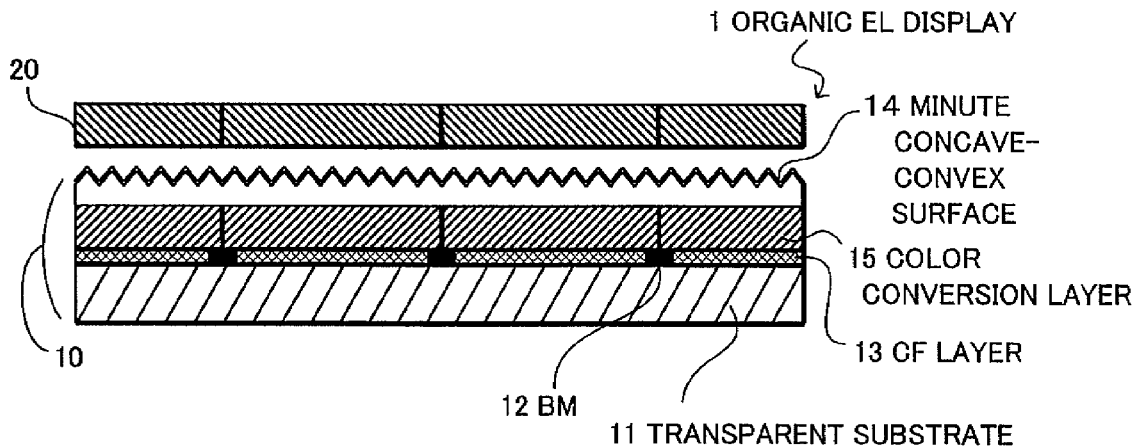
Figure 2A:
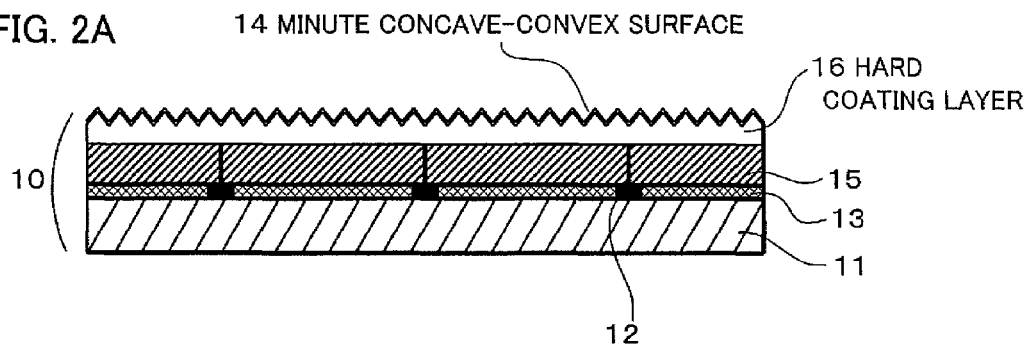
FIGS. 2A to 2C are diagrams showing the forming position of a minute concave-convex surface of an optical filter.
Figure 2B:
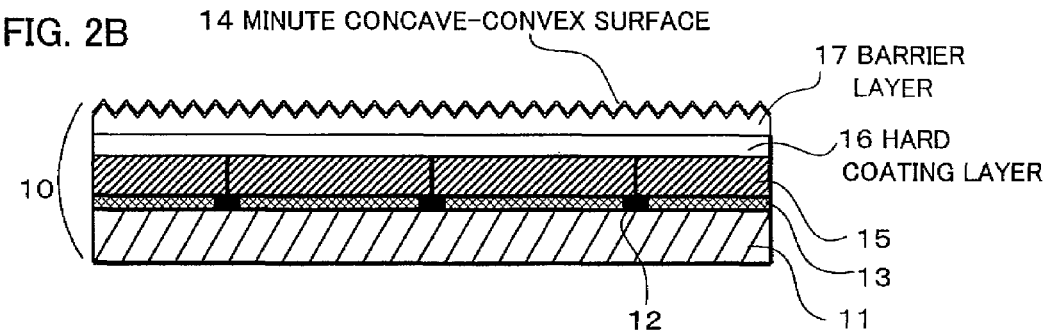
Figure 2C:
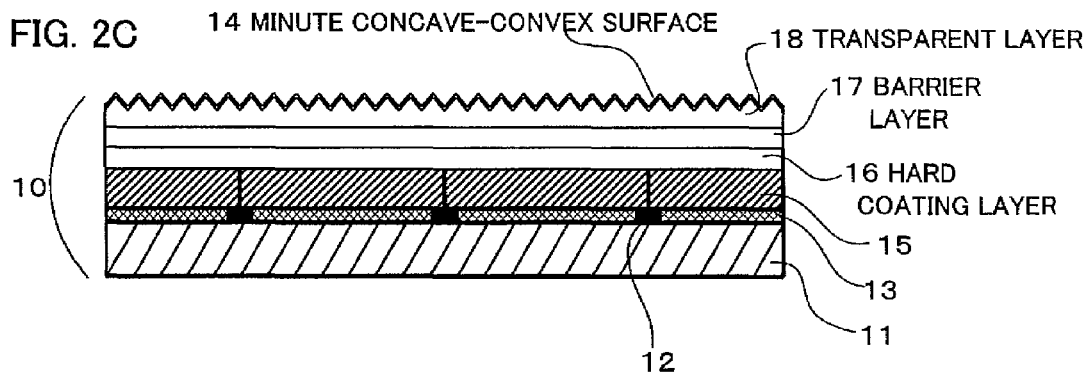
Figure 3:
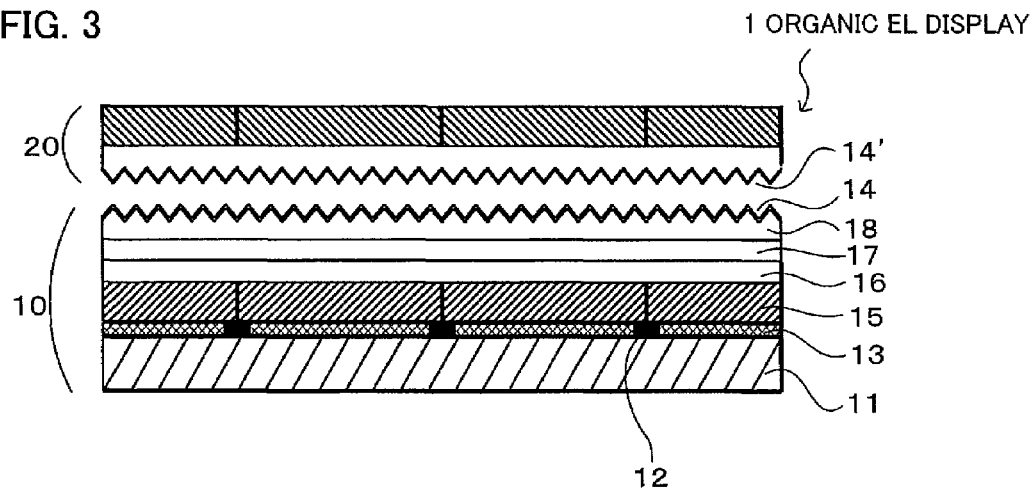
FIG. 3 is a diagram showing an organic EL display with a minute concave-convex surface on the organic EL element side.

FIGS. 1A to 1C are diagrams showing an organic EL display provided by combining various types of the optical filters of the present invention with an organic EL element. FIGS. 2A to 2C are diagrams showing the position of providing a minute concave-convex surface for providing the reflection preventing property of the optical filter of the present invention. FIG. 3 is a diagram showing an organic EL display with a concave-convex surface having an endless number of minute concave-convex formed by a pitch of the wavelength of the light or less, also on the organic EL element side. FIGS. 4A to 4E are diagrams showing the cross sectional shape of the minute concave-convex surface. FIGS. 5A to 5C are diagrams showing the arrangement of the minute concave-convex of the minute concave-convex surface.

In the organic EL display of the present invention, as it is shown in FIGS. 1A to 1C, an optical filter 10 comprising a transparent substrate 11 has a minute concave-convex surface 14 with an endless number of minute concave-convex formed by a pitch of the wavelength of the light or less, on the surface. And an organic EL element 20 is disposed on the minute concave-convex surface 14. Here, "above" and "below" in this specification is based on the drawings. Moreover, the "wavelength of the light or less" substantially denotes the wavelength of the visual light or less, which is 400 nm or less.

As shown in FIG. 1A, the optical filter 10 comprises for example, a black matrix (it is shown as "BM" in the drawings) 12 laminated on the transparent substrate 11, and a color filter layer (it is shown as "CF layer" in the drawings) 13 laminated at a position corresponding to an opening part of the black matrix 12 laminated. By further laminating a layer with a minute concave-convex surface 14 on the upper surface, the minute concave-convex surface 14 is provided above the color filter layer 13. As it will be explained later, the layer with the minute concave-convex surface 14 may be various layers. The optical filter 10 composes an organic EL display 1 together with an organic EL element 20 to be disposed above. The organic EL element 20 comprises a light emitting layer for emitting a light per each pixel. The color filter layer 13 has the function to correct the color correction of the incident light provided by the light emission of the organic EL element 20.

As shown in FIG. 1B, the optical filter 10 of the present invention may comprise the black matrix 12 laminated on the transparent substrate 11, with a color conversion layer 15 laminated at a position corresponding to the opening part of the black matrix 12, with a minute concave-convex surface 14 provided above the color conversion layer 15. The layer with the minute concave-convex surface 14 may be various kinds of layers. The optical filter 10 comprises the organic EL display 1 together with the organic EL element 20 disposed above. The organic EL element 20 comprises a light emitting layer for emitting a light per each pixel. The color conversion layer 15 has the function to convert the color of the incident light provided by the light emission of the organic EL element 20.

As shown in FIG. 1C, the optical filter 10 of the present invention may comprise the black matrix 12 laminated on the transparent substrate 11, with a color filter layer 13 and a color conversion layer 15 laminated in this order at a position corresponding to the opening part of the black matrix 12, with a minute concave-convex surface 14 provided above the color conversion layer 15. The layer with the minute concave-convex surface 14 may be various kinds of layers. The optical filter 10 composes the organic EL display 1 together with the organic EL element 20 disposed above. The organic EL element 20 comprises a light emitting layer for emitting a light per each pixel. The color conversion layer 15 has the function to convert the color of the incident light provided by the light emission of the organic EL element 20, and the color filter 13 has further function to correct the color of the light after the color conversion by the color conversion layer 15.

Although the minute concave-convex surface 14 is explained to be provided on the upper surface of the layer laminated on the color filter layer 13 in the example explained with reference to FIG. 1A, the minute concave-convex surface 14 may be provided directly on the upper surface of the color filter layer 13. Also in the examples explained with reference to FIGS. 1B and 1C, the minute concave-convex surface 14 may be provided directly on the upper surface of the color conversion layer 15.

However, practically, since various kinds of layers may be added and laminated on the color filter layer 13 in the optical filter 10 of the example explained with reference to FIG. 1A, and various kinds of layers may be laminated on the color conversion layer 15 of the examples explained with reference to FIGS. 1B and 1C, the minute concave-convex surface 14 may be provided on the added and laminated various kinds of the layers. FIGS. 2A to 2C show the state of providing the minute concave-convex surface 14 on the various kinds of the added and laminated layers.

As shown in FIG. 2A, the optical filter 10 may comprise a light transmittance hard coating layer 16 laminated on the upper surface thereof, with a minute concave-convex surface 14 provided on the upper surface of the hard coating layer 16. In FIGS. 2A to 2C, although the part of the layers lower than the hard coating layers 16 is described as one with the black matrix layer 12 laminated on the transparent substrate 11, and the color filter layer 13 and the color conversion layer 15 laminated in this order at a position corresponding to the opening part of the black matrix 12, from the lowermost layer side, the added and laminated various kinds of the layers with the minute concave-convex surface 14 are not limited to the case of having all the three of the black matrix 12, the color filter layer 13 and the color conversion layer 15 on the transparent substrate 11. That is, the added and laminated various kinds of the layers with the minute concave-convex surface 14 may either be the case of having the two of the black matrix 12 and the color filter layer 13 on the transparent substrate 11, the case of having the two of the black matrix 12 and the color conversion layer 13, the case of having only the color filter layer 13, or the case of having only the color conversion layer 13.

As shown in FIG. 2B, the optical filter 10 may comprise a hard coating layer 16 and a light transmittance barrier layer 17 laminated in this order on the upper surface thereof, with a minute concave-convex surface 14 provided on the upper surface of the barrier layer 17. A "minute concave-convex surface 14 provided on the upper surface" in this case includes the case of providing the minute concave-convex on the upper surface of the barrier layer 17 not reaching to the hard coating layer 16 as the lower layer, and the case of providing the minute concave-convex corresponding to the upper surface of the barrier layer 17 and the upper surface of the hard coating layer 16 as the lower layer.

As shown in FIG. 2C, the optical filter 10 may comprise a hard coating layer 16, a barrier layer 17 and a transparent layer (light transmittance) 18 laminated in this order on the surface thereof, with a minute concave-convex surface 14 provided on the upper surface of the transparent layer 18. A "minute concave-convex surface 14 provided on the upper surface" in this case includes the case of (1) providing the minute concave-convex on the upper surface of the transparent layer 18 not reaching to the upper surface of the barrier layer 17 as the lower layer, the case of (2) providing the minute concave-convex on the upper surface of the transparent layer 18, reaching to the upper surface of the barrier layer 17 as the lower layer, not reaching to the upper surface of the hard coating layer 16 as the further lower layer, the case of (3) providing the minute concave-convex on the upper surface of the transparent layer 18, reaching to the barrier layer 17 as the lower layer, and further reaching to the upper surface of the hard coating layer 16 as the further lower layer, or the like.

FIGS. 4A to 4E are diagrams showing the cross sectional shape of the minute concave-convex of the minute concave-convex surface 14 comprising the optical filter 10 of the present invention.

Figure 4A:
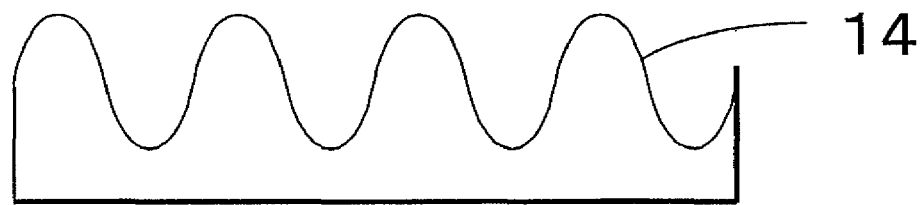
FIGS. 4A to 4E are diagrams showing the cross sectional shape of the minute concave-convex of the minute concave-convex surface.
Figure 4B:
Figure 4C:
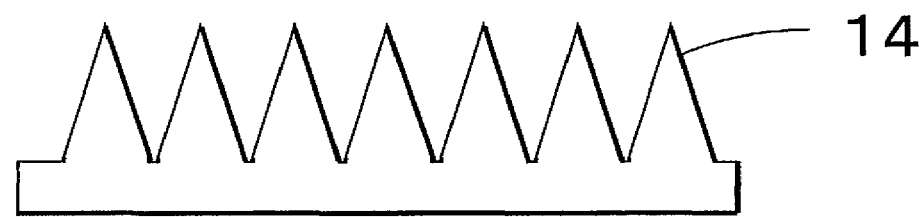
Figure 4D:
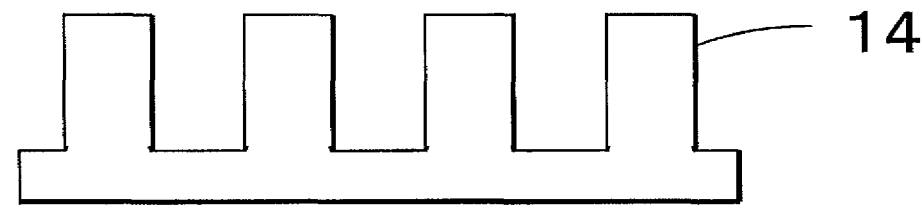
Figure 5A:
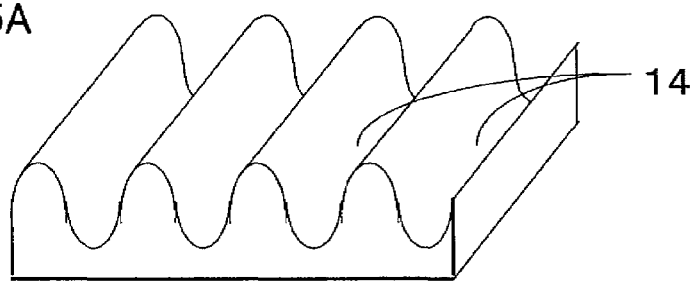
FIGS. 5A to 5C are diagrams showing the planar arrangement of the minute concave-convex.
Figure 5B:
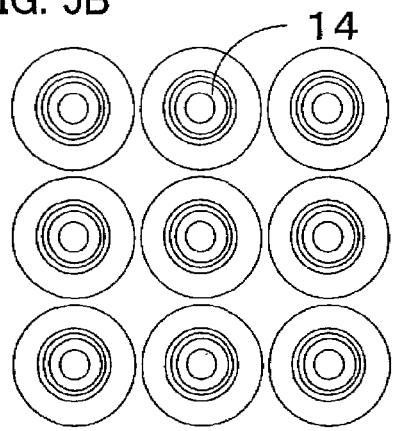
Figure 5C:
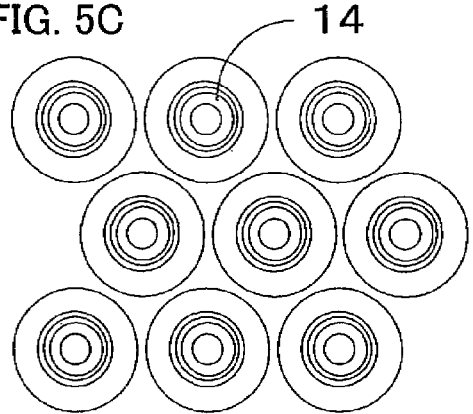

The cross sectional shape of the minute concave-convex of the minute concave-convex surface 14 may be, for example, one with the upper rim part of the minute concave-convex cross section shaped like a sine curve as shown in FIG. 4A, one with top part of the cross section shaped like an arc and straight shaped rise up part tapered toward the upper direction as shown in FIG. 4B, one with a triangular wave like shape as shown in FIG. 4C or one with a rectangular wave like shape as shown in FIG. 4D.

Among those explained with reference to FIGS. 4A to 4D, those having a cross sectional shape tapered toward the upper direction, deepness varies depending on the horizontal position of the figure, such as FIGS. 2A, 2B and 2C are preferable. By using the cross section shaped like these, the property of which the refractive index of the light varies depending on the position in the thickness direction of the layer with the minute concave-convex surface 14 can be provided.

In a case the minute concave-convex surface 14 is formed on the upper surface of the transparent plastic layer and is in contact with the air, since there is only the air without the presence of the transparent plastic layer in the top part in the figure, the refractive index in this part is the refractive index of the air itself, however, since the ratio (area ratio) of the transparent plastic layer is increased toward the lower direction, the refractive index is increased continuously so that there is only the transparent plastic layer at the bottom part of the concave-convex of the minute concave-convex surface 14, and thus the refractive index of the part is the refractive index of the transparent plastic layer itself. Since the refractive index is changed continuously, the reflection of the incident light is prevented so that the incident efficiency of the light from the minute concave-convex surface 14 can be improved.

In FIG. 4D, since the area of the horizontal cross section dose not change in any part of the layer thickness direction, that is, the ratio of the layer is the same, the refractive index of the light dose not change in the upper direction and in the lower direction in the figure. However, by setting the pitch or the wave width, a layer having a certain and constant refractive index can be formed.

Figure 4E:
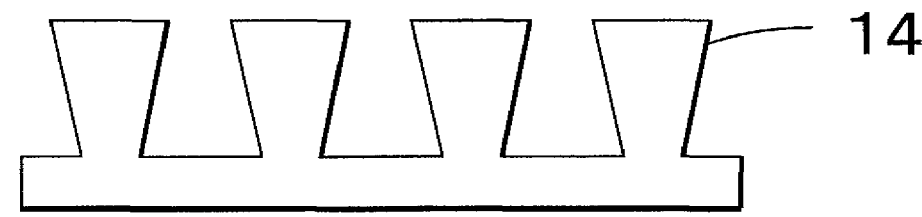

Although a shape tapered toward the lower direction in the figure as shown in FIG. 4E is considerable, it can hardly be released from the mold in the case of producing with a mold, and thus it is not preferable.

When observing the minute concave-convex surface 14 with these cross shaped minute concave-convex from the minute concave-convex surface 14 side, as the arrangement of the minute concave-convex, there are one in which concave parts (or the convex parts) are parallel to each other as shown in the perspective view of FIG. 5A, and one with a planar arrangement as shown in contour maps of FIG. 5B or FIG. 5C (a part closer to the concentric circle indicates higher part). Since one having one orientation arrangement as the type explained with reference to FIG. 5A has the refractive index changeable according to the direction of the incident light. On the other hand, since one not having one orientation arrangement as the type shown in FIG. 5B or 5C does not substantially have an orientation, it is preferable.

Although the shapes of the minute concave-convex include various types, the pitch (=cycle) of the waves of the concave-convex in the cross sectional shape is minute of a wavelength of a light or less, that is, 400 nm or less, more preferably 300 nm or less. Although the lower limit is not particularly set, it is preferably 100 nm or more in consideration of the accuracy of the mold.

Since larger height difference of the wave of the minute concave-convex provides a lower refractive index so as to provide the reflection preventing effect, the height difference is preferably 100 nm or more. Although the upper limit is not particularly set, in consideration to the ordinary pitch of about 200 nm to 300 nm, it is preferably 50% to 200% of the pitch value, and thus it is about 100 nm to 600 nm.

The above mentioned minute concave-convex surface 14 may be formed when forming the layer with the minute concave-convex surface 14 on the upper surface, or the minute concave-convex surface 14 may be formed after the formation of the layer beforehand. As the material for forming the layer with the minute concave-convex surface 14 on the upper surface, a transparent resin is preferable, in terms of the easy formation of the minute concave-convex. In terms of the excellent physical property and chemical property of the formed minute concave-convex surface 14, it is preferable to use a thermosetting resin composition and cure the composition to form the surface, rather than to use a thermoplastic resin composition. In particular, it is further preferable to use an ionizing radiation curing type resin composition and cure the composition to form the surface.

To forming the minute concave-convex surface 14 on the upper surface of the layer, using the ionizing radiation curing type resin composition, when forming a layer of the ionizing radiation curing type resin by coating or the like, for example, a method of forming a transfer film capable of transferring the layer, and transferring by using the transfer film, or the like can be adopted. The above transfer film can be formed by: curing the composition with the layer surface covered with a patterning film with the minute concave-convex on the surface; pressing patterning means, such as a patterning roller, against the formed uncured layer while heating as needed; or forming a layer on a peeling type base material, with the minute concave-convex on the peeling surface, by coating or the like. In any case, it is cured by an appropriate timing. In the case the layer with the minute concave-convex surface 14 is provided independently from the color filter layer 13 or the color conversion layer 15, transparent composition is used as the ionizing radiation curing type resin composition. In a case where the minute concave-convex surface 14 is formed together with forming the color filter layer 13 or the color conversion layer 15, predetermined colored composition is used as the ionizing radiation curing type resin composition.

A more preferably method for forming the minute concave-convex surface 14, including the preparation of the patterning means such as the patterning film and the patterning roller, is as follows. First, an appropriate base material with a photosensitive resin composition (ultraviolet ray curing type resin composition) layer laminated thereon is prepared, and the photosensitive resin composition layer is exposed by the laser light interference method. As the photosensitive resin composition, those with a film commercially available for the production of the relief hologram can be used. The exposure is carried out with the laser beam divided into two or more, so as to interfere with each other, so that a cured part and an uncured part are obtained by the pitch of the wavelength of the light or less. After the exposure, by developing the above by a developing method depending to the kind of the photosensitive resin composition, for example, by removing the uncured part with a certain solvent, an original mold, having the mold surface with an endless number of the minute concave-convex by the pitch of the wavelength of the light or less, is obtained.

Since the obtained original mold is made of a polymer having a relatively small molecular weight for facilitating the formation of the concave-convex, endurance to the solvents is not sufficient. Moreover, since it is often friable, it is not preferable to duplicate the minute concave-convex surface 14 by using the original mold over and over. Therefore, it is preferable to plate the original mold with a metal such as a nickel to form a first metal mold and use this first metal mold, or to plate the first metal mold to form several second metal molds and use the obtained second metal molds for the duplication. These metal molds are often referred to as metal stampers. It is more preferable to use a mold roller with the shape of accordingly obtained flat mold surface formed on the roller surface, and block planted (providing multiple surfaces on one block surface) as needed.

At the time of duplicating the mold surface shape, the original mold and the second metal mold have the same shape, and the original mold and the first metal mold have the shapes opposite with each other. Moreover, the minute concave-convex shape of the minute concave-convex surface 14 in the present invention and the minute concave-convex shape of the mold surface of the mold for producing the same have the shapes opposite with each other. Therefore, in order to obtain the minute concave-convex shape desired as the minute concave-convex surface 14, the minute concave-convex shape can be inverted, as needed, in addition to the metal mold formation by plating. However, as in the case of the sine curve, depending on the cross sectional shape of the minute concave-convex, the original mold shape and the inverted mold shape may not be different. As the minute concave-convex shape of the mold surface of the mold to be used in the description below, except for the above mentioned exceptions, it is formed into the opposite shape so as to obtain the desired minute concave-convex shape on the reflection preventing film.

The formation of the minute concave-convex surface 14 by using the mold roller can be carried out by, supplying the ionizing radiation curing type resin composition between the mold roller and a sheet like product while running the sheet like product, which is the subject, along the mold roller, irradiating an ionizing radiation to the ionizing radiation curing type resin composition held between the mold roller and the sheet like product to cross-link and cure the ionizing radiation curing type resin composition and also to bond the same to the sheet like product, and then, peeling and rolling off the layer of the cured ionizing radiation curing type resin composition together with the sheet like product from the mold roller.

Instead of forming the minute concave-convex surface 14 by using the mold roller, it can be formed by using a mold patterning film with the mold surface or a flat plate like mold (=mold plate), laminating the sheet like product, which is the subject, on the mold surface via the ionizing radiation curing type resin composition, irradiating the ionizing radiation to the ionizing radiation curing type resin composition held in between to cross-link and cure, and to bond the same with the sheet like product, and then peeling off the layer of the cured ionizing radiation curing type resin composition together with the sheet like product from the patterning film or the flat plate like mold (=mold plate).

The transparent substrate 11 is a supporting member for supporting the optical filter 10 in the present invention. At the time of forming the organic EL display 1, it is often a supporting member disposed on the observation side for supporting the entire organic display 1. As needed, a hard coating layer for preventing the friction, a charge preventing layer, a pollution preventing layer, a reflection preventing layer, a blurring preventing layer, or the like may further be laminated directly on the observation side, or laminated on the transparent film. Or functions such as a touch panel function may be added.

The transparent substrate 11, on the whole, is made of an inorganic plate like transparent material such as a glass and a quartz glass, or an organic (=synthetic resin) plate like transparent material such as an acrylic resin, or a synthetic resin transparent film like material. Very thin glass can also be used as the transparent film like material. As the transparent substrate 11, the surface of the side on which the black matrix 12, the CF layer 13, the color conversion layer 14, or the like are formed preferably has a high smoothness, that is, one having an arithmetic average roughness (Ra) of 0.5 nm to 3.0 nm (5 square µm area).

As the synthetic resin for the synthetic resin material for forming the transparent substrate 11, an acrylic resins such as a polycarbonate resin, a polyallylate resin, a polyether sulfone resin and a methyl methacrylate resin, a cellulose resin such as a triacetyl cellulose resin, an epoxy resin, a cyclic olefin resin, a cyclic olefin copolymer resin or the like can be listed.

The black matrix 12 is for sectioning the areas for emitting the light per each pixel, and also preventing the reflection of the external light at the boundary of the sections for emitting the lights to improve the contrast of the picture or the image. Although it is not always necessarily to be provided, it is preferable to form the same for producing the layers thereafter, such as the color filter layer 13 and the color conversion layer 15, corresponding to the opening part of the black matrix 12, in addition to the improvement of the contrast. The black matrix 12 is generally formed into a vertical and lateral lattice like shape of black narrow lines, or into a pattern with an opening part such as one orientation lattice like shape. The light emitted by the organic EL element 20 reaches to the observation side via the opening part of the black matrix 12.

The black matrix 12 can be formed by the processes of coating a photo resist on the surface of a thin film of a metal, such as chromium, provided by vapor deposition, ion plating, sputtering or the like, exposing the above covered with a pattern mask, developing, etching, peeling off, cleaning or the like. Or it can also be formed by the electroless plating method, the printing method using a black ink composition or the like. The thickness of the black matrix 12 is about 0.2 µm to 0.4 µm in the case of forming a thin film, and it is about 0.5 µm to 2 µm in the case of forming by the printing method.

The color filter layer 13 is provided corresponding to the opening part of the black matrix 12. It generally has three kinds for blue, green and red arranged regularly corresponding to each pixel. The parts of each color of the color filter layer 13 may be provided per opening part of the black matrix 12. For the convenience, it may be provided in bands in the direction from the front side toward the back side of FIGS. 1 to 3.

In the CCM type organic EL display, since a blue light, for example, emitted from the organic EL element 20 is converted by the color conversion layer 15 so as to generate the lights of the three primary colors of a blue light, a green light and a red light, the color image can be reproduced owing to the presence of the color conversion layer 15 so that the color filter layer 13 can be omitted. However, in order to improve the color performance property of the organic EL display 1 by further correcting the light converted by the color conversion layer 15 to transmit only the light within a predetermined band, it is preferable to provide the color filter layer 13.

The color filter layer 13 can be formed by patterning a photosensitive resin composition layer colored by a coloring agent such as a pigment and a dye, or preferably by containing a pigment by the photolithography method, or by preparing an ink composition colored in a predetermined color and printing at a predetermined position per each color. The thickness of the color filter layer 13 is about 1 μm to 2 μm.

As the pigment for forming the red color filter layer, one kind or two or more kinds of the pigments selected from a perylene based pigment, a lake pigment, an azo based pigment, a quinacridone based pigment, an anthraquinone based pigment, an anthracene based pigment, an isoindoline based pigment, or the like can be preferably presented. As the pigment for forming the green color filter layer, one kind or two or more kinds of the pigments selected from a phthalocyanine pigment such as a halogen multi substituted phthalocyanine based pigment and a halogen multi substituted copper phthalocyanine based pigment, a triphenylmethane based basic dye, an isoindoline based pigment, or an isoindolynone based pigment can be preferably presented. Moreover, as the pigment for forming the blue color filter layer, one kind or two or more kinds of the pigments selected from a copper phthalocyanine based pigment, an anthraquinone based pigment, an indanthrene based pigment, an indophenol based pigment, a cyanine based pigment, or a dioxazine based pigment can be preferably presented.

As the above mentioned binder resin for blending the coloring agent, transparent ones, preferably ionizing radiation curing type resins of 50% or more visible light transmittance, particularly commercially available ones as "photo resist" using ultraviolet ray curing type resins, can be used. A coating composition of colored photosensitive resin is prepared by blending the above mentioned coloring agent into such a binder resin so that the content in the color filter layer to be formed will be 5 to 50%, a composition for coating a colored photosensitive resin can be prepared.

Since the color conversion layer 15 is provided corresponding to the opening part of the black matrix 12 and the color filter layer 13, the three kinds are also arranged regularly for the blue color, the green color and the red color for each pixel. As to the blue color conversion layer, in the case the organic EL element emits a blue light, or a blue light and a green light, since the color conversion needs not be executed, it can be omitted, however, it is preferable to form a clear layer, as a dummy layer, having the same thickness as color conversion layers for the other colors.

Each part of the color conversion layer 15 can be provided only at the opening part of the black matrix 2 as the parts of each color of the color filter layer 13, or it may be provided in bands in the direction from the front side toward the back side of FIGS. 1 to 3.

Each of red color conversion layer and the green color conversion layer is composed of a composition in which a red color conversion fluorescent material for converting the blue color into the red color or a green color conversion fluorescent material for converting the blue color into the green color dissolved or dispersed in the resin.

As the red color conversion fluorescent material, a cyanine based pigment such as a 4-dicyanomethylene-2-methyl-6-(p-dimethylaminostyryl)-4H-pyrane, a pyridine based pigment such as a 1-ethyl-2-[4-(p-dimethylaminophenyl)-1,3-butadienyl]-pyridium-perchlorate, a rhodamine based pigment such as a rhodamine B and a rhodamine 6G, an oxadine based pigment or the like can be presented as the examples.

As the green color conversion fluorescent material, a coumalin pigment such as a 2,3,5,6-1H,4H-tetrahydro-8-trifluoromethylquinolidino (9,9a,1-gh) coumalin, a 3-(2'-benzothiazolyl)-7-diethylaminocoumalin, and a 3-(2'-benzimidazolyl)-7-N,N-diethylaminocoumalin, a coumalin pigment based dye such as a basic yellow 51, a naphthalimide based pigment such as a solvent yellow 11, and a solvent yellow 116 or the like can be presented as the examples.

As the resin for dissolving or dispersing the red color conversion fluorescent material or the green color conversion fluorescent material, a transparent resin such as a polymethyl methacrylate resin, a polyacrylate resin, a polycarbonate resin, a polyvinyl alcohol resin, a polyvinylpyrrolidone resin, a hydroxylethylcellulose resin, a carboxymethylcellulose resin, a polyvinyl chloride resin, a melamine resin, a phenol resin, an alkyd resin, an epoxy resin, a polyurethane resin, a polyester resin, a maleic acid resin, and a polyamide resin or the like can be presented as the examples. Or as the resin, an ionizing radiation curing type resin having a reactive vinyl group such as an acrylate based ones, a methacrylate based ones, a polyvinyl cinnamate based ones, and acyclic rubber based ones (practically, it is an electron beam curing type resin or an ultraviolet ray curing type resin, and in most cases, it is likely to be the latter) can be used as well.

The color conversion layer 15 can be formed by the photolithography method, or it can be formed by preparing an ink composition by mixing the red color conversion fluorescent material or the green color fluorescent material and the resin, as needed, with a solvent, a diluting agent or an appropriate additive, and printing. The clear layer for the blue color can be formed according to the above mentioned method, except that the red color conversion fluorescent pigment or the green color conversion fluorescent pigment is left out from the composition or the ink composition to be used. The ratio of the resin and the red color conversion fluorescent material or the green color conversion fluorescent material in the color conversion layer 15 is preferably, for example, about resin/fluorescent material=100/0.5 to 100/5 (based on the mass), and the thickness of the color conversion layer 15 is preferably about 5 μm to 20 μm.

The hard coating layer 16 is provided, in a case where the thickness of the lower layer is not even, for the purpose of flattening these surfaces or for the purpose of prolonging the life of the organic EL element 20 or the like by separating each upper layers, in particular, the organic EL element 20 and the color conversion layer 15 as a lower layer. Moreover, the hard coating layer 16 also plays the role of protecting the lower layer.

The hard coating layer 16 is formed preferably by using the same transparent resin as mentioned above as the resin for providing the color conversion layer 15. Among the above, it is preferably provided as a cured product of an ionizing radiation curing type resin having a reactive vinyl group such as an acrylate based ones, a methacrylate based ones, a polyvinyl cinnamate based ones, a cyclic rubber based ones or the like. Although the thickness of the hard coating layer 16 depends on the concave-convex state of the lower layer, it is preferably 1 μm to 5 μm, and it is preferable to form with a high surface smoothness.

The transparent barrier layer 17 may be laminated on the hard coating layer 16. The barrier layer 17 is preferably composed of a thin film of an inorganic oxide so that the permeation of the air, particularly the water vapor, from below to the organic EL element 20, which is disposed as an upper layer, can be blocked more effectively. As the inorganic oxide, a silicon oxide, an aluminum oxide, a titanium oxide, or a silicon nitride, or an alloy of a silicon oxide and a silicon nitride, or the like can be used preferably. The thickness of the barrier layer 17 is about 0.03 μm to 3 μm.

The transparent layer 18 is a layer for forming the minute concave-convex surface 14 to prevent the reflection. In the case of forming the minute concave-convex surface 14 on the upper surface of the barrier layer 17 or on the upper surface of the hard coating layer 16 as the lower layer, the minute concave-convex surface 14 should be formed without deteriorating the function of these layers. However, in the case of forming the minute concave-convex surface 14 on the transparent layer 18, since the barrier layer 17 and the hard coating layer 16 are already laminated as the lower layers, the transparent layer 18 is formed only for the purpose of forming the minute concave-convex surface 14. Therefore, the optical filter 10, having the laminated structure with the transparent layer 18 laminated, can be obtained easily by adding the transparent layer 18 with the minute concave-convex surface 14 to the one having the laminated structure with the hard coating layer 16 and the barrier layer 17 laminated. The transparent layer 18 can be formed by selecting a material which the minute concave-convex surface 14 is easy to form with. Specifically, it can be selected from those presented above as the resins for providing the hard coating layer 16.

The organic EL element 20 is basically composed of one with the transparent electrode layer, the organic EL light emitting layer and the rear electrode layer laminated corresponding to each pixel. As to the driving method, either a passive matrix one or an active matrix one can be used. As needed, a sealing material can further be laminated.

The transparent electrode layer is for inducing the emission of a light at a predetermined position by applying a voltage to the organic EL light emitting layer interposed between the rear electrode layer. The transparent electrode layer is, for example, in FIGS. 1 to 3, arranged in horizontally, in the direction from the front side to the back side of the figure, with a gap in between by the same pitch of the arrangement of the opening parts of the black matrix 12. Each electrode has a band-like shape of a width corresponding to the width of the opening part of the black matrix 12.

The transparent electrode layer comprises a thin film of a transparent and conductive metal oxide. It is composed of, for example, with an indium tin oxide (ITO), an indium oxide, a zinc oxide, a stannic oxide, or the like as the material. The transparent electrode is preferably formed by forming an even thin film of the above mentioned materials by the deposition method, the sputtering method or the like, and then, eliminating the unnecessary part by the photolithography method.

As mentioned above, the organic EL light emitting layer is (1) one with the organic EL light emitting layers for emitting lights of each color for the red color light emission, the green color light emission and the blue color light emission arranged, in the method in which the three primary colors are arranged, (2) an organic EL light emitting layer for white color light emission, in the method in which the organic EL element for emitting white light is combined with the color filter layers of the three primary colors, or (3) an organic EL light emitting layer for the blue color light emission, or for the blue color and green color light emission, in the CCM method.

There are organic EL light emitting layers of various structures, representatively of structures such as (1) one comprising an organic EL light emitting layer alone, (2) one provided with a positive hole injecting layer on the transparent electrode layer side of the organic EL light emitting layer, (3) one provided with the electron injecting layer on the rear electrode layer side of the organic EL light emitting layer, (4) one provided with the positive hole injecting layer on the transparent electrode layer side of the organic EL light emitting layer and the electron injecting layer on the rear electrode layer side or the like.

The organic EL light emitting layer can be formed with, for example, a pigment based, metal complex based or polymer based organic fluorescent material.

As the pigment based ones, a cyclopendamine derivative, a tetraphenylbutadiene derivative, a triphenylamine derivative, an oxadiazol derivative, a pyrazoloquinoline derivative, a distylylbenzene derivative, a distylylarylene derivative, a sylol derivative, a thiophene ring compound, a pyridine ring compound, a pelynone derivative, a pelylene derivative, an oligothiophene derivative, an oxadiazol dimmer, a pyrazoline dimmer, or the like can be presented.

As the metal complex based ones, a metal complex having an Al, a Zn, a Be, or the like, or a rare earth metal such as a Tb, an Eu, a Dy as the center metal, and an oxadiazol, a thiadiazol, a phenyl pyridine, a phenyl benzoimidazol, a quinoline structure, or the like as the ligand, or the like, such as an aluminum quinolinol complex, a benzoquinolinol beryllium complex, a benzoxazol zinc complex, a benzothiazol zinc complex, an azomethyl zinc complex, a porphyline zinc complex, an europium complex, or the like can be presented.

As the polymer based one, a polyparaphenylenevinylene derivative, a polythiophene derivative, a polyparaphenylene derivative, a polysilane derivative, a polyacetylene derivative or the like, a polyfluolene derivative, a polyvinyl carbazol derivative or a polymer of the above mentioned pigment based ones or metal complex based ones or the like can be presented.

Doping can be executed to the above mentioned organic fluorescent material, for the purpose of improving the light emitting efficiency or changing the light emitting wavelength. As the doping material, for example, a perylene derivative, a coumalin derivative, a rubrene derivative, a quinacrydone derivative, a squarium derivative, a porphylene derivative, a styryl based pigment, a tetracene derivative, a pyrazoline derivative, a decacyclene, a phenoxazone or the like can be presented.

As the organic fluorescent material capable of obtaining the blue to blue green color light emission to be used in the CCM method, fluorescent whitening agent of a benzothiazol based, benzimidazol based, benzoxazol based or the like disclosed in Japanese Patent Application Laid Open (JP-A) No. 8-279394, a metal chelating oxinoide compound disclosed in JP-A No. 63-295695, a styryl benzene based compound disclosed in the specification of the Europe Patent No. 0319881 or the specification of the Europe Patent No. 0373582, a distyryl pyrazine derivative disclosed in JP-A No. 2-252793, an aromatic dimethylidine based compound disclosed in the specification of the Europe Patent No. 0388768 or JP-A No. 3-231970 or the like can be presented as the examples.

Specifically, as the benzothiazol based ones, a 2-2'-(p-phenylenedivinylene)-bisbenzothiazol or the like, as the benzoimidazol based ones, a 2-[2-[4-(2-benzoimidazolyl) phenyl]vinyl]benzoimidazol, a 2-[2-(4-carboxylphenyl)vinyl]

benzoimidazol or the like, and as the benzoxazol based one, a 2,5-bis(5,7-di-t-pentyl-2-benzoxazolyl)-1,3,4-thiadiazol, a 4,4'-bis(5,7-t-pentyl-2-benzoxazolyl)stylbene, a 2-[2-(4-chlorophenyl)vinyl]naphto[1,2-d]oxazol or the like can be presented as the examples.

As the metal chelating oxinoide compound, a 8-hydroxyquinoline based metal complex such as a tris(8-quinolinol) aluminum, a bis(8-quinolinol) magnesium and a bis(benzo[f]-8-quinolinol) zinc, or a dilithiumepintolidion or the like, and as the styrylbenzene based compound, a 1,4-bis(2-methylstyryl)benzene, a 1,4-bis(3-methylstyryl) benzene, a 1,4-bis(4-methylstyryl)benzene, a distyrylbenzene, a 1,4-bis(2-ethylstyryl) benzene, a 1,4-bis(3-ethylstyryl) benzene, a 1,4-bis(2-methylstyryl)-2-methyl benzene and a 1,4-bis(2-methylstyryl)-2-ethyl benzene or the like can be presented as the examples.

As the distyrylpyrazine derivative, a 2,5-bis(4-methylstyryl)pyrazine, a 2,5-bis(4-ethylstyryl) pyrazine, a 2,5-bis[2-(1-naphtyl)]vinyl]pyaradine, a 2,5-bis(4-methoxystyryl) pyrazine, a 2,5-bis[2-(4-biphenyl) vinyl]pyrazine, or a 2,5-bis[2-(1-pyrenyl)vinyl]pyrazine or the like, and as the aromatic dimethylidine based compound, a 1,4-phenylenedimethylidine, a 4,4-phenylenedimethylidene, a 2,5-xylenedimethylidene, a 2,6-naphthylenedimethylidene, a 1,4-biphenylenedimethylidene, a 1,4-p-terephenylene dimethylidene, a 9,10-anthracene diildylmethylidene, a 4,4'-bis(2,2-di-t-butylphenylvinyl)biphenyl, a 4,4'-bis(2,2-diphenylvinyl)biphenyl, or the like, or a derivative thereof can be presented as the examples.

As the organic fluorescent material for the blue color light emission to be used in the CCM method, a compound represented by the general formula (Rs-Q) 2-AL-O-L (wherein Lisa hydrocarbon having 6 to 24 carbon atoms including benzene rings, O-L is a phenylate ligand, Q is a substituted 8-quinolinolate ligand, and Rs is a 8-quinolinolate ring substituted group selected so as to 3-dimensionally disturb the bonding of two or more substituted 8-quinolinolate ligands to an aluminum atom) disclosed in JP-A No. 5-258862, or the like can be presented as the examples. Specifically, a bis(2-methyl-8-quinolinolate) (para-phenylphenolate) aluminum (III), or a bis(2-methyl-8-quinolinolate) (1-naphtolate) aluminum (III), or the like can be presented as the examples.

The thickness of the organic EL light emitting layer made of or containing the above mentioned materials is not particularly limited, for example, it can be about 5 nm to 5 µm.

The material for composing the positive hole injecting layer can be selected and used optionally from known materials conventionally used as the positive hole injecting material of a non conductive material, or those conventionally used for the positive hole injecting layer of the organic El element. Either of an organic material and an inorganic material having the positive hole injecting property or the electron barrier property can be used.

Specifically, as the material for composing the positive hole injecting layer, a triazol derivative, an oxadiazol derivative, an imidazol derivative, a polyarylalkane derivative, a pyrazolin derivative, a pyrazolon derivative, a phenylenediamine derivative, an arylamine derivative, an amino substituted calcone derivative, an oxazol derivative, a styrylanthracene derivative, a fluorenone derivative, a hydrazone derivative, a stylbene derivative, a silazane derivative, a polysilane based, anyline based copolymer, or a conductive polymer oligomer such as a thiophene oligomer can be presented as the examples. Furthermore, as the material for the positive hole injecting layer, a porphyline compound, an aromatic tertiary amine compound, a styryl amine compound or the like can be presented as the examples.

Specifically, as the porphyline compound, a porphine, a 1,10,15,20-tetraphenyl-21H,23H-porphine copper (II), an aluminum phthalocyanine chloride, and a copper octamethyl phtalocyanine, or the like, as the aromatic tertiary amine compound, a N,N,N',N'-tetrapheyl-4,4'-diaminophenyl, a N,N'-diphenyl-N,N'-bis-(3-methyl phenyl)-[1,1'-lbiphenyl [4,4'-diamine, a 4-(di-p-tolylamino)-4'-[4(di-p-tolylamino) styryl]stylbene, 3-methoxy-4'-N,N-diphenyl aminostylbenzene, a 4,4'-bis[N-(1-naphtyl)-N-phenylamino]biphenyl, a 4,4'-,4"-tris[N-(3-methylphenyl)-N-phenylamino]triphenyl amine, or the like can be presented as the examples.

The thickness of the positive hole injecting layer made of the materials presented as the examples is not particularly limited, for example, it can be about 5 nm to 5 µm.

As the material for composing the electron injecting layer, a heterocyclic tetracarboxylic acid anhydride such as a nitro substituted fluorine derivative, an anthraquinodimethane derivative, a diphenyl quinine derivative, a thiopyran dioxide derivative, and a naphthalene perylene, or a carbodiimide, a fluorenylidene methane derivative, an anthraquinodimethane and an anthrone derivative, an oxadiazol derivative, or a thiazol derivative obtained by substituting an oxygen atom of an oxadiazol ring of an oxadiazol derivative with a sulfur atom, a quinoxaline derivative having a quinoxaline ring known as an electron attractive group, a metal complex of a 8-quinolinol derivative such as a tris(8-quinolinol) aluminum, a phtalocyanine, a metal phtalocyanine, a distyryl pyrazine derivative or the like can be presented as the examples.

The thickness of the electron injecting layer made of the materials as the examples is not particularly limited, for example, it can be about 5 nm to 5 µm.

The rear electrode layer is another electrode for inducing the emission of the organic EL light emitting layer. The rear electrode layer is composed of a metal, an alloy or a mixture thereof having a small work function of about 4 eV or less. Specifically, a sodium, a sodium-potassium alloy, a magnesium, a lithium, a magnesium/copper mixture, a magnesium/silver mixture, a magnesium/aluminum mixture, a magnesium/indium mixture, an aluminum/aluminum oxide ($Al_2O_3$) mixture, an indium, or lithium/aluminum mixture, a rare earth metal, or the like can be presented as the examples. More preferably, a magnesium/silver mixture, a magnesium/aluminum mixture, a magnesium/indium mixture, an aluminum/aluminum oxide ($Al_2O_3$) mixture, and a lithium/aluminum mixture can be presented. The rear electrode layer made of these materials can be formed preferably by forming an even thin film of these materials by the vapor deposition method, the sputtering method or the like, and removing the unnecessary part by the photolithography method. In the case the organic EL element 20 is provided using a TFT substrate, the pixel electrode of the TFT substrate is used as the rear electrode layer. By using the TFT substrate, an organic EL display having a large screen size can be provided, and thus it is advantageous.

Figure 6:
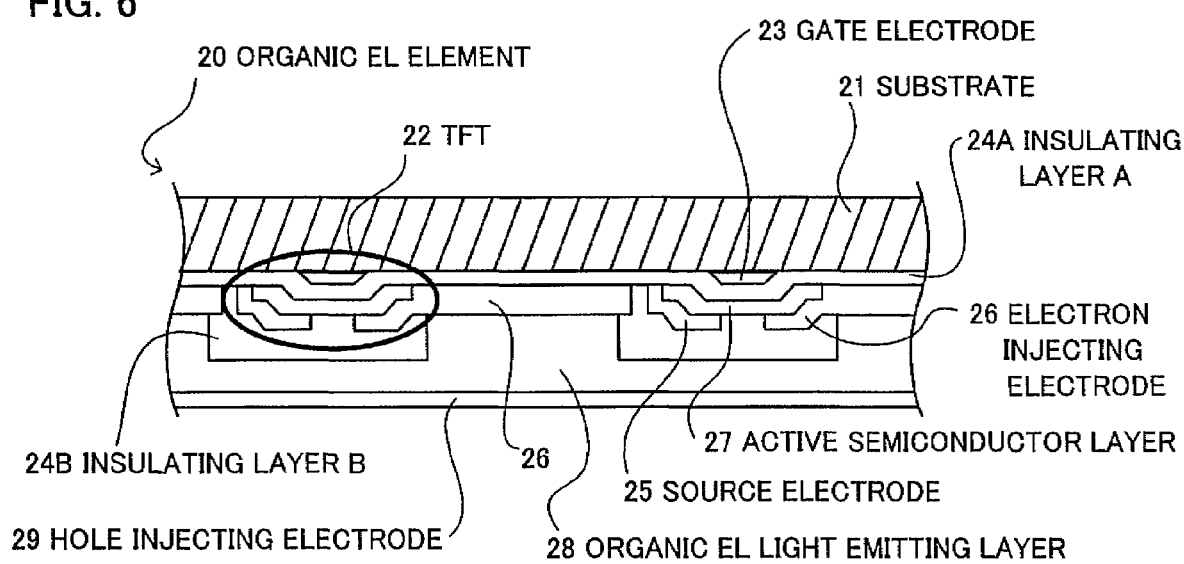
FIG. 6 is a diagram showing the structure of an organic EL element.

As shown in FIG. 6, the TFT 22 is provided by laminating a gate electrode 23 on the lower surface side in the figure of the substrate 21, laminating an insulating layer A (numeral; 24A) for insulating the gate electrode 23, on the lower surface of the gate electrode 23, laminating a source electrode 25 and an active semiconductor layer 27 such as a poly crystalline silicone comprising an electron injecting electrode 26 on the lower surface of the insulating layer A (numeral; 24A), and further laminating an insulating layer B (numeral; 24B) thereon for flattening. On the lower surface of the TET 22, an organic EL light emitting layer 28 and a hole injecting electrode (transparent electrode layer) 29 are laminated successively. In the example shown in the figure, the organic EL element 20 to be driven by the TFT 22 using the electron injecting electrode 26 of the TFT 22, elongating in the right direction, as the rear electrode layer is provided. Although it is not shown in the figure, the rear electrode layer can be provided on the source electrode 25 side instead of the electron injecting electrode 26 side.

It is preferable that the rear electrode layer has a sheet resistance of a few hundred Ω/cm or less. The thickness is preferably about 10 nm to 1 μm, and it is more preferably about 50 to 200 nm.

Although one with the minute concave-convex surface 14 on the side facing the organic EL element 20 of the optical filter 10 has been explained as the organic EL display 1 in the description above, as the organic EL display 1, as shown in FIG. 3, one with the minute concave-convex surface 14' on the surface of the optical filter 10 side can be used as the organic EL element 20. In the case the organic EL element 20 has the minute concave-convex surface 14', the organic EL display 1 can be provided by using one without the minute concave-convex surface 14 as a partition filter 10. The minute concave-convex surface 14' of the organic EL element 10 can be formed on the lower surface side of the organic EL element 20, generally on the lower surface of a transparent resin laminated on the transparent electrode layer side, by the aforementioned method. Although it can be provided using a thermoplastic resin composition, it is preferably formed by using a thermosetting resin composition and curing the same, or more preferably, by using an ionizing radiation curing type resin composition and curing the same.

When providing the organic EL display using the optical filter 10 and the organic EL element 20, they can be contacted closely or a gap can be provided in between. For the purpose of maintaining the gap constant, spacer particles used in the liquid crystal cell can be intervened in between them, or a pillar like member, provided on either or both of them so as to face to each other, can be used. Moreover, when there is a gap in between the optical filter 10 and the organic EL element 20, the space can be filled with a transparent resin. By doing so, the bonding force between the optical filter 10 and the organic EL element 20 can be improved, or deterioration of the organic fluorescent material in the organic El element 20 due to the intrusion of the air or the water from the gap can be prevented, and thus it is preferable.

EXAMPLES

Example 1

(Formation of the Black Matrix)

As a transparent base material, a soda glass of 150 mm ×150 mm, and 0.7 mm thickness (produced by Central Glass Co. Ltd.) was prepared. A thin film (thickness; 0.2 μm) of a nitride oxide composite chromium was formed on the entire surface of one side of the transparent base material by sputtering. By coating a photosensitive resist on the composite chromium thin film, a mask exposure, developing, etching of the composite chromium thin film and peeling off the resist are carried out in this order, a black matrix having 80 μm×280 μm rectangular shaped opening parts arranged on the matrix by a 100 μm pitch in the shorter side direction and a 300 μm pitch in the longer side direction was formed.

(Formation of the Color Filter Layer)

Photosensitive paint compositions for forming three color filter layers of red, green and blue were prepared. As the red coloring agent, a condensed azo based pigment (produced by Ciba-Geigy Japan Limited, Chromophtal red BRN), as the green coloring agent, a phthalocyanine based green pigment (produced by TOYO INK MFG. CO., LTD., Lionol Green 2Y-301), and as the blue coloring agent, an anthraquinone based pigment (produced by Ciba-Geigy Japan Limited, Chromophtal blue A3R) were used respectively, as the binder resin, a polyvinyl alcohol (10% aqueous solution) was used. By containing 1 part (part is based on the mass) of each coloring agent with respect to 10 parts of a polyvinyl alcohol aqueous solution, mixing and dispersing sufficiently, and adding 1 part of an ammonium bichromate as the cross-linking agent with respect to 100 parts of the obtained solution, a photosensitive paint composition for each color filter layer formation was obtained.

The color filter layers of each color were formed successively using the above photosensitive paint compositions for the color filter layer formation. That is, photosensitive paint composition for the red color filter layer formation was coated, on the transparent base material with the black matrix formed, by the spin coating method, and pre-baked at 100° C. for 5 minutes. Thereafter, it was exposed using a photo mask, and it was developed with a developing agent (0.05% KOH aqueous solution). Then, the above was post-baked at 200° C. for 60 minutes. With the black matrix pattern synchronized with the opening parts, a band like shaped red color pattern of a 85 μm width and a 1.5 μm thickness was formed with the width direction thereof corresponding to the shorter side direction of the black matrix opening part. Thereafter, using photosensitive paint composition for the green color filter layer formation and photosensitive paint composition for the blue color filter layer formation successively, the green color pattern and the blue color pattern were formed so that a color filter layer with the three color patterns arranged repeatedly in the width direction was formed.

(Formation of the Color Conversion Fluorescent Material Layer)

A blue color conversion dummy layer forming coating solution (produced by FUJIFILM OLIN Co., Ltd., transparent photosensitive resin composition, product name; "Color Mosaic CB-701") was coated, by the spin coating method, on the surface with the black matrix and the color filter layers formed, and pre-baked at 100° C. for 5 minutes. Then, after patterning by the photolithography method, the above was post-baked at 200° C. for 60 minutes. Thereby, a band-like shaped blue color conversion dummy layer of a 85 μm width and a 10 μm thickness was formed on the blue color filter layer.

Then, using an alkaline soluble negative type photosensitive resist, with a green color conversion fluorescent material (produced by Sigma-Aldrich Co., Coumalin 6) dispersed, as the green color conversion layer forming coating solution, a band-like shaped green color conversion layer of a 85 μm width and a 10 μm thickness was formed on the green color filter layer by the same procedure as mentioned above.

Furthermore, using an alkaline soluble negative type photosensitive resist, with a red color conversion fluorescent material (produced by Sigma-Aldrich Co., Rhodamine 6G) dispersed, as the red color conversion layer forming coating solution, a band-like shaped red color conversion layer of a 85 μm width and a 10 μm thickness was formed on the red color filter layer by the same procedure as mentioned above.

(Formation of the Hard Coating Layer)

Then, a hard coating layer forming coating solution prepared by diluting an acrylate based thermosetting resin (produced by Nippon Steel Chemical Group, product name; "V-259PA/PH5") with a propylene glycol monomethyl ether acetate was coated, by the spin coating method, on the surface with the color conversion layer formed. After pre-baking at 120° C. for 5 minutes, the entire surface was exposed such that the irradiating amount of the ultraviolet ray becomes 300 mJ. After the exposure, the above was post-baked at 200° C. for 60 minutes to form a transparent hard coating layer of a 5 μm thickness so as to cover the entire color conversion layer.

(Formation of the Barrier Layer)

A SiON thin film of a 300 nm thickness was formed on the previously formed hard coating layer by the sputtering method so as to provide the transparent barrier layer.

(Formation of the Transparent Layer with the Minute Concave-Convex)

With an ultraviolet ray curing type acrylate based paint (produced by Dainichiseika Color & Chemicals Mfg. Co., Ltd., hard coating layer forming paint, product name; PCD04 (R-2)) placed on the formed transparent barrier layer at the center of the base material, and a polycarbonate resin mold sheet, with a minute concave-convex mold on the lower surface side, placed thereon, they were pressed with a roller to spread the paint between the transparent barrier layer and the mold sheet to the entire surface. After irradiating an ultraviolet ray and hot pressing the entire surface, the mold sheet was peeled, thus, a transparent layer with the minute concave-convex on the upper surface was formed on the transparent barrier layer.

(Evaluation)

The optical filter of the example accordingly obtained, and for the comparison, an optical filter of the comparative example obtained by the same manner as mentioned above except that a transparent layer with the minute concave-convex is not formed were used. They were superimposed on a blue color excitation light source (blue color LED with peak wavelength; 172 nm, half band width; 50 nm) so that a side of the optical filter which is opposite to the transparent substrate will be on the light source side. The red color light spectrum output from the transparent substrate side of the optical filter was measured with a microscope spectrometer (both microscope and spectrometer are produced by Olympus Corporation, product number of the spectrometer; OSP-200). Moreover, the spectrum of the blue color excitation light source was measured in a state without superimposing the optical filter. The brightness and the chromaticity (CIE1931) were calculated from the obtained spectral radiance spectrum and the color matching function y, and the value, obtained by dividing the brightness when the color conversion substrate is superimposed by the brightness of the blue color excitation light source, was defined as the brightness conversion efficiency. As a result of the evaluation, it was confirmed that the optical filter of the example 1 has improved brightness conversion efficiency with respect to the optical filter of the comparative example.

The invention claimed is:

1. An organic EL display comprising:
   an optical filter having a laminated body with at least a color filter layer, for color correction of an incident light per each pixel, laminated on a transparent substrate; and
   an organic EL element having a light emitting layer for emitting a light per each pixel,
   wherein the optical filter has a minute concave-convex surface with an endless number of minute concave-convex formed, by a pitch of the wavelength of the light or less, on a surface of the laminated body which is a surface opposite to the transparent substrate, and
   further wherein the organic EL element is disposed on the minute concave-convex surface side of the optical filter.

2. The organic EL display according to claim 1, wherein the optical filter and the organic EL element are disposed with a gap in between.

3. The organic EL display according to claim 2, wherein a space in between the optical filter and the organic EL element is filled with a transparent resin.

4. The organic EL display according to claim 1, wherein a minute concave-convex surface with an endless number of minute concave-convex formed, by the pitch of the wavelength of the light or less, is provided on the optical filter side of the EL element.

5. The organic EL display according to claim 1, wherein the organic EL element is of an active matrix driving type.

6. An organic EL display comprising:
   an optical filter having a laminated body with at least a color conversion layer, for color conversion of an incident light per each pixel, laminated on a transparent substrate; and
   an organic EL element having a light emitting layer for emitting a light per each pixel,
   wherein the optical filter has a minute concave-convex surface with an endless number of minute concave-convex formed, by a pitch of the wavelength of the light or less, on a surface of the laminated body which is a surface opposite to the transparent substrate, and
   further wherein the organic EL element is disposed on the minute concave-convex surface side of the optical filter.

7. The organic EL display according to claim 6, wherein the optical filter and the organic EL element are disposed with a gap in between.

8. The organic EL display according to claim 7, wherein a space in between the optical filter and the organic EL element is filled with a transparent resin.

9. The organic EL display according to claim 6, wherein a minute concave-convex surface with an endless number of minute concave-convex formed, by the pitch of the wavelength of the light or less, is provided on the optical filter side of the EL element.

10. The organic EL display according to claim 6, wherein the organic EL element is of an active matrix driving type.

11. An organic EL display comprising:
    an optical filter having a laminated body with at least two layers of a color filter layer for color correction of an incident light per each pixel and a color conversion layer for color conversion of the incident light per each pixel are laminated in this order on a transparent substrate; and
    an organic EL element having a light emitting layer for emitting a light per each pixel,
    wherein the optical filter has a minute concave-convex surface with an endless number of minute concave-convex formed, by a pitch of the wavelength of the light or less, on a surface of the laminated body which is a surface opposite to the transparent substrate, and
    further wherein the organic EL element is disposed on the minute concave-convex surface side of the optical filter.

12. The organic EL display according to claim 11, wherein the optical filter and the organic EL element are disposed with a gap in between.

13. The organic EL display according to claim 12, wherein a space in between the optical filter and the organic EL element is filled with a transparent resin.

14. The organic EL display according to claim 11, wherein a minute concave-convex surface with an endless number of minute concave-convex formed, by the pitch of the wavelength of the light or less, is provided on the optical filter side of the EL element.

15. The organic EL display according to claim 11, wherein the organic EL element is of an active matrix driving type.

* * * * *